(12) United States Patent
Kim et al.

(10) Patent No.: US 7,880,221 B2
(45) Date of Patent: *Feb. 1, 2011

(54) FORMING METAL-SEMICONDUCTOR FILMS HAVING DIFFERENT THICKNESSES WITHIN DIFFERENT REGIONS OF AN ELECTRONIC DEVICE

(75) Inventors: Eunha Kim, Menlo Park, CA (US); Wen Yu, Freemont, CA (US); Minh-Van Ngo, Fremont, CA (US); Kyunghoon Min, Palo Alto, CA (US); Hiu-Yung Wong, Sunnyvale, CA (US)

(73) Assignee: Spansion LLC, Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/340,274

(22) Filed: Dec. 19, 2008

(65) Prior Publication Data

US 2009/0140325 A1    Jun. 4, 2009

Related U.S. Application Data (62) Division of application No. 11/949,637, filed on Dec. 3, 2007, now Pat. No. 7,482,217.

(51) Int. Cl.
*H01L 29/792* (2006.01)
(52) U.S. Cl. ........... 257/326; 257/E29.17; 257/E29.307
(58) Field of Classification Search ................. 257/314, 257/316, 326, E21.683, E29.17, E29.307
See application file for complete search history.

(56) References Cited

U.S. PATENT DOCUMENTS

| | | | |
|---|---|---|---|
| 5,780,929 A | 7/1998 | Zeininger et al. | |
| 5,904,564 A | 5/1999 | Park | |
| 6,037,204 A | 3/2000 | Chang et al. | |
| 6,096,647 A | 8/2000 | Yang et al. | |
| 6,103,610 A * | 8/2000 | Blair | 438/592 |
| 6,242,348 B1 | 6/2001 | Kamal et al. | |
| 6,410,382 B1 | 6/2002 | Huh et al. | |

(Continued)

FOREIGN PATENT DOCUMENTS

EP            0938136 A        8/1999

OTHER PUBLICATIONS

Sun, Wein-Town et al., "Suppression of Cobalt Silicide Aggolmeration Using Nitrogen (N2+) Implantation," IEEE Electron Device Letters, vol. 19, No. 5, May 1998, pp. 163-166.
PCT/US2008/085443 International Search Report, Mar. 6, 2009, 3 pages.

*Primary Examiner*—Quoc D Hoang (57) ABSTRACT

A method of forming an electronic device is provided that includes selectively implanting ions into a workpiece, wherein ions are implanted into a first region of the workpiece that includes a semiconductor material, while substantially none of the ions are implanted into a second region of the workpiece that also includes a semiconductor material. The method further includes depositing a metal-containing film over the first region and the second region after selectively implanting, and then reacting the metal-containing film with the semiconductor material to form a first metal-semiconductor film within the first region and a second metal-semiconductor film within the second region. The first metal-semiconductor film has a first thickness and the second metal-semiconductor film has a second thickness that is different from the first thickness.

20 Claims, 8 Drawing Sheets

U.S. PATENT DOCUMENTS

| | | |
|---|---|---|
| 6,512,264 B1 | 1/2003 | Ogle, Jr. et al. |
| 6,559,018 B1 | 5/2003 | Liu et al. |
| 6,984,574 B2 | 1/2006 | Fortin et al. |
| 7,078,758 B2 | 7/2006 | Shinkawata |
| 7,238,569 B2 | 7/2007 | Torii |
| 7,476,582 B2 * | 1/2009 | Nakagawa et al. .......... 438/201 |
| 7,482,217 B1 * | 1/2009 | Kim et al. ................... 438/199 |
| 2005/0101076 A1 | 5/2005 | Nakabayashi |
| 2006/0240635 A1 | 10/2006 | Shiraiwa et al. |

* cited by examiner

FORMING METAL-SEMICONDUCTOR FILMS HAVING DIFFERENT THICKNESSES WITHIN DIFFERENT REGIONS OF AN ELECTRONIC DEVICE

CROSS-REFERENCE TO RELATED APPLICATION(S)

The following disclosure is a divisional application, which claims priority to U.S. Application Ser. No. 11/949,637 filed Dec. 3, 2007, entitled "Forming metal-semiconductor films having different thicknesses within different regions of an electronic device" and having named inventors, Eunha Kim, Wen Yu, Minh-Van Ngo, Kyunghoon Min, and Hiu-Yung Wong, which application is incorporated by reference herein in its entirety.

BACKGROUND

1. Field of the Disclosure

The present disclosure is directed to a method of forming an electronic device, and more particularly, forming metal-semiconductor films having different thicknesses within different regions of an electronic device.

2. Description of the Related Art

Transistors, such as CMOS transistors, are created such that certain portions have low-resistivity regions. Particular low-resistivity regions can be formed for electrical contacts, and can include the formation of a metal-semiconductor film (e.g., a silicide film) typically including a process of salicidation in the case of a silicon film including a metal material. Some typical metal-semiconductor films include titanium silicide (e.g., $TiSi_2$), nickel silicide (e.g., NiSi), and cobalt silicide (e.g., $CoSi_2$). However, certain problems are associated with the formation of such metal-semiconductor films. For example, the metal-semiconductor film may be susceptible to certain defects, such as "mouse bites" or agglomeration, which are thought to be linked to the thickness of the metal-semiconductor film formed and the amount of silicon available within the region during the forming process.

Figure 1:
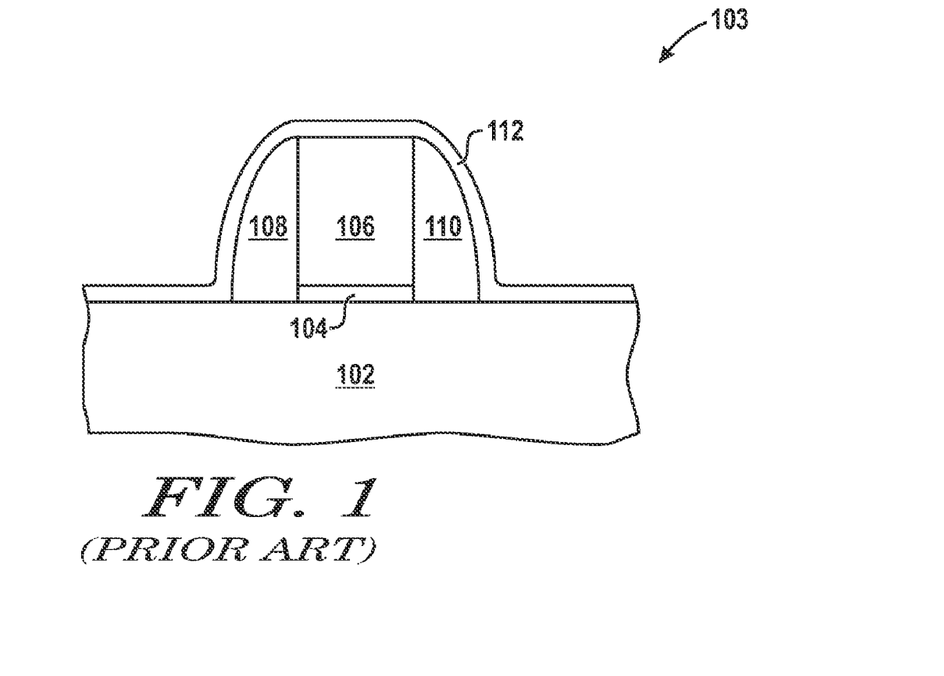
FIG. 1 is a cross-sectional illustration of a workpiece including a substrate and a transistor structure overlying the substrate after depositing a cobalt film in accordance with a prior art method.
Figure 2:
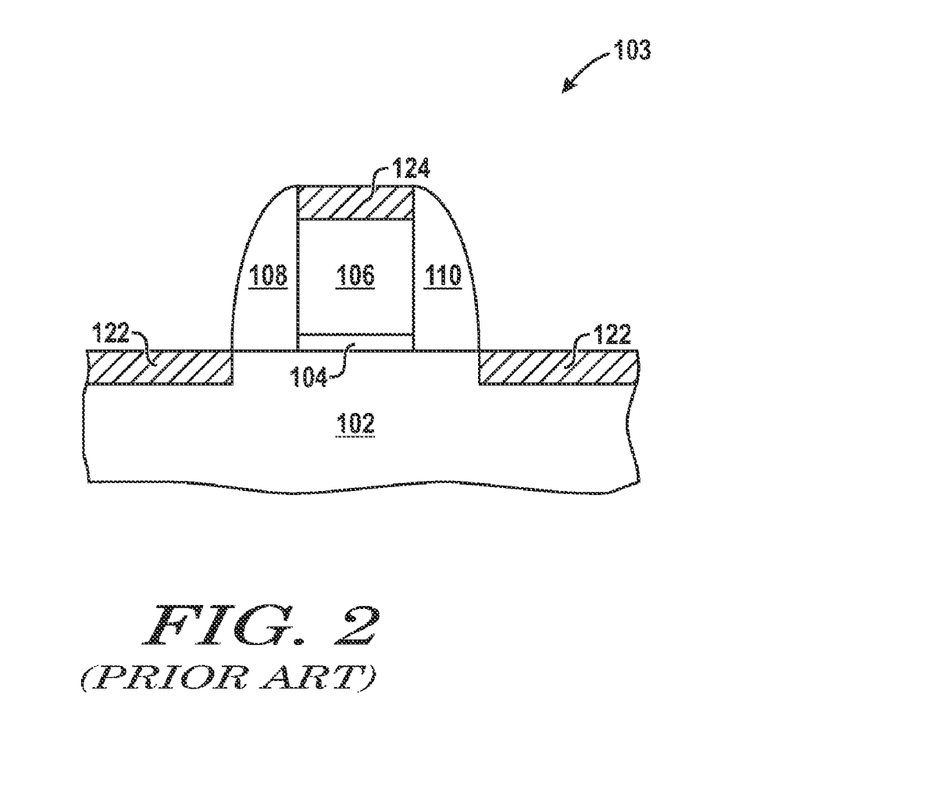
FIG. 2 is a cross-sectional illustration of the workpiece FIG. 1 after reacting the cobalt film and forming metal-semiconductor film portions in accordance with a prior art method.

FIGS. 1-2 illustrate a typical prior art method of forming a metal-semiconductor film. FIG. 1 includes a cross-sectional illustration of a transistor structure 103 including a gate oxide film 104, gate electrode 106, and spacers 108 and 110 formed over a substrate 102. Typically, the salicidation process is initiated by forming a cobalt film 112 over the transistor structure 103. After forming the cobalt film, the process continues as illustrated in FIG. 2 by reacting the cobalt film 112 with silicon to form metal-semiconductor film portions 122 and 124 and removing unreacted portions of the metal-semiconductor film. Such a reaction can typically include heat treatment, such as an annealing technique. The metal-semiconductor film portions 122 formed on the source and drain regions of the transistor structure 103 are generally uniform, typically having the same thickness. Moreover, metal-semiconductor film portions formed on source and drain regions of other transistor structures (not illustrated) have the same thickness as metal-semiconductor film portions 122 of transistor structure 103. Additionally, the metal-semiconductor film portion 124 formed on a portion of the gate electrode 106 will have the same thickness as other metal-semiconductor film portions formed on other gate electrodes.

While such a process facilitates the formation of a metal-semiconductor film the formation of such films may be susceptible to agglomeration, grooving, or other defects.

DESCRIPTION OF THE DRAWINGS

The present disclosure may be better understood, and its numerous features and advantages made apparent to those skilled in the art by referencing the accompanying drawings.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

Generally, workpieces having electronic devices thereon can include different types of electronic components, such as transistors, capacitors, diodes, and resistors. In the context of transistors, different types of transistors can be used in different electronic components including for example memory arrays and logic devices. The use of the transistor may influence certain operating parameters and design differences, such as the type of materials used with the structure or the thickness of certain films. In certain electronic devices, it may be desirable to form transistors having layers or films of different thicknesses. In one example, a transistor structure within a memory array can be formed having a metal-semiconductor film of a different thickness than a metal-semiconductor film of a transistor structure within a peripheral component, such as a logic component. In particular, it may be desirable that a transistor within a memory array have a thinner metal-semiconductor film than a metal-semiconductor film of a transistor within a peripheral component.

In an exemplary, non-limiting embodiment, a process of forming metal-semiconductor films (e.g., silicide films) within different electronic components having different thicknesses is provided. The process includes selectively implanting ions into a workpiece, such that ions are implanted into a first region of the workpiece having a transistor structure including a semiconducting material, while substantially none of the ions are implanted into a second region of the workpiece having a different transistor structure and also including the semiconducting material. The process further includes depositing a metal-containing film over the first region and the second region, and then reacting the metal-containing film with the semiconductor material to form a first metal-semiconductor film within the first region and a second metal-semiconductor film within the second region. As such, the first metal-semiconductor film can have a different thickness than the second metal-semiconductor film.

Attention is now directed to particular embodiments of forming an electronic device through processes illustrated in FIGS. 3-16. FIGS. 3-10 describe a process of forming metal-semiconductor films having different thicknesses within different electronic components by selectively implanting ions within particular regions of the workpiece to impede a reaction between a semiconductor material and a metal-containing material and facilitate the formation of a thinner metal-semiconductor film as compared to regions that are not implanted. FIGS. 11-16 describe an alternative embodiment of forming metal-semiconductor films having different thicknesses within different electronic components by selectively implanting ions within particular regions to cause implant damage and accelerate a reaction between a semiconductor material and a metal-containing material and facilitate the formation of a thicker metal-semiconductor film as compared to regions that are not implanted.

Figure 3:
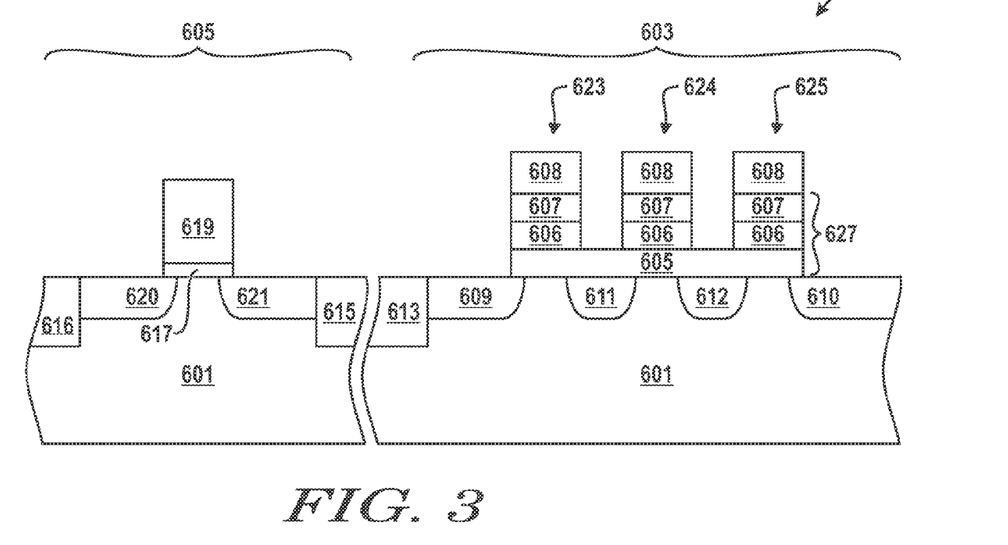
FIG. 3 includes a cross-sectional illustration of a portion of a workpiece including a substrate, a portion of a memory array overlying the substrate, and a peripheral transistor structure overlying the substrate and spaced apart from the memory array in accordance with an embodiment.

Referring now to FIGS. 3-10 an embodiment of forming metal-semiconductor films having different thicknesses within different electronic components is described. FIG. 3 includes a cross-sectional illustration of a portion of a workpiece 600 including a substrate 601, a portion of a memory array 603 (hereinafter "memory array 603") overlying the substrate 601, and a peripheral transistor structure 605 overlying the substrate 601 and spaced apart from the memory array 603. The substrate 601 can be a workpiece facilitating the formation of electronic components thereon. Generally, the substrate 601 can include a semiconductive material or an insulative material, or any combination thereof. For example, the substrate can include a monocrystalline semiconductor wafer, semiconductor-on-insulator (SOI) wafer, a flat panel display (e.g., a silicon layer over a glass plate), or other substrate conventionally used to form electronic devices. Additionally, the substrate 601 can be doped such that it includes a n-type or p-type dopant.

As illustrated, the memory array 603 includes transistor structures 623, 624, and 625 (623-625) for one or more memory cells within the memory array 603. Each of the transistor structures 623-625 includes multiple layers including layer 605 which can be shared between each of the transistor structures 623-625. In particular, layer 605 can include an electrically insulating material, such as an oxide. Each of the transistor structures 623-625 further includes a charge-storage layer 606. In one particular embodiment, the layer 606 within each of the transistor structures 623-625 includes silicon nitride. In another embodiment, layer 606 can include polysilicon. The transistor structures 623-625 further include a layer 607, which can include an electrically insulating material, such as an oxide. The combination of layers 605, 606, and 607 present within transistor structures 623-625, can be referred to as an ONO stack. Transistor structures 623-625 further include a layer 608 overlying the ONO stack 627, which can be a control gate electrode. Layer 608 can include a semiconducting material, such as silicon.

The memory array 603 can be part of a data storage device, such as a non-volatile storage component, for example an EEPROM component. In one particular embodiment, the memory array is a flash memory cell.

The workpiece 600 further includes source/drain regions 609, 610, 611, and 612 (609-612) within the substrate 601 and underlying portions of the memory array 603. The source/drain regions 609-612 can include implant regions, including dopants within the substrate 601, such as a n-type dopant or a p-type dopant. According to one particular embodiment, the source/drain regions 609-612 are n-type implant regions. In a more particular embodiment, the source/drain regions 609-612 include arsenic (As). The source/drain region 609-612 can be formed by a conventional or proprietary technique.

The workpiece can further include field isolation regions 613, 615, and 616. The field isolation regions 613 and 615 electrically insulate the memory array 603 and the peripheral transistor structure 605 from each other. The field isolation region 616 can electrically insulate the peripheral transistor structure 605 from another structure (not illustrated). Field isolation regions 613, 615, and 616 can include an electrically insulating material, such as an oxide, nitride, oxynitride, or any combination thereof. In one embodiment, the field isolation regions 613, 615, and 616 include silicon dioxide.

The peripheral transistor structure 605 can include a layer 617 over the substrate 601 and a layer 619 overlying layer 617. In particular, layer 617 can be an electrically insulating material, such as an oxide. Layer 619 overlies layer 617 and can include a semiconducting material, such as silicon, and more particularly a polysilicon gate material. The peripheral transistor structure 605 can include a low power digital transistor, such as a transistor used in transistor-to-transistor logic or the like.

The workpiece 600 further includes source/drain regions 620 and 621 within the substrate 601 and partially underlying portions of the peripheral transistor structure 605. Like the source/drain regions 609-612, the source/drain regions 620 and 621 can be formed by implanting dopants within the substrate 601. Source/drain regions 620 and 621 can include a n-type dopant or a p-type dopant. According to one particular embodiment, the source/drain regions 620 and 621 can include a n-type dopant, for example arsenic.

Figure 4:
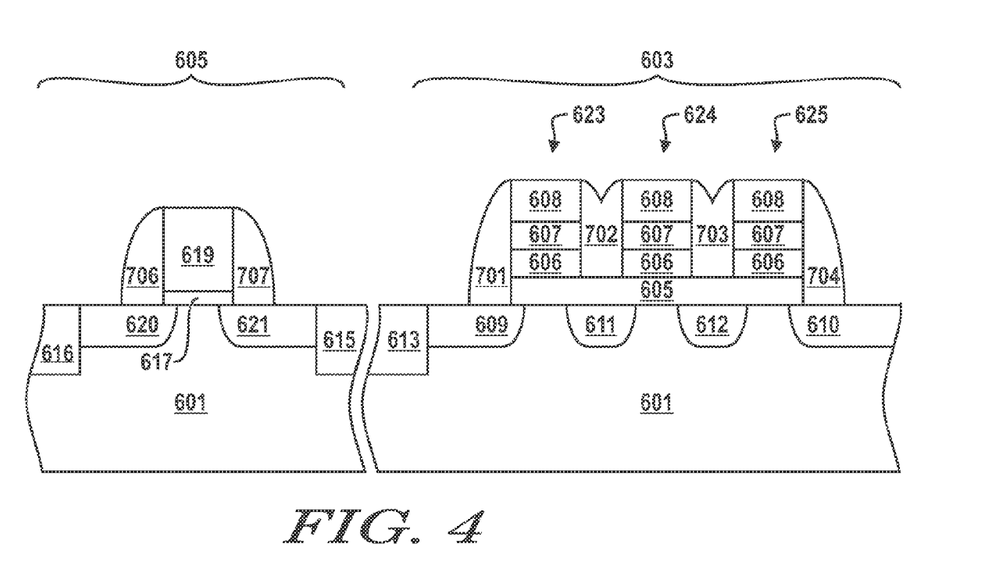
FIG. 4 includes a cross-sectional illustration of the portion of the workpiece of FIG. 3 after forming spacer structures within the memory array and the peripheral transistor structure in accordance with an embodiment.

FIG. 4 includes a cross-sectional illustration of the portion of the workpiece of FIG. 3 after forming spacer structures within the memory array 603 and the peripheral transistor structure 605. The memory array 603 includes spacer structures 701, 702, 703, and 705 (701-705) formed on the sides and between the transistor structures 623-625. The spacer structures 701-705 within the memory array 603 facilitate electrical insulation between the transistor structures 623-625. The peripheral transistor structure 605 further includes spacer structures 706 and 707 formed on the sides. The spacers structures 701-705, 706 and 707 formed on portions of the workpiece may be formed by a conventional or proprietary technique. Moreover, spacers structures 701-705, 706 and 707 can include an electrically insulating material, such as an oxide.

Figure 5:
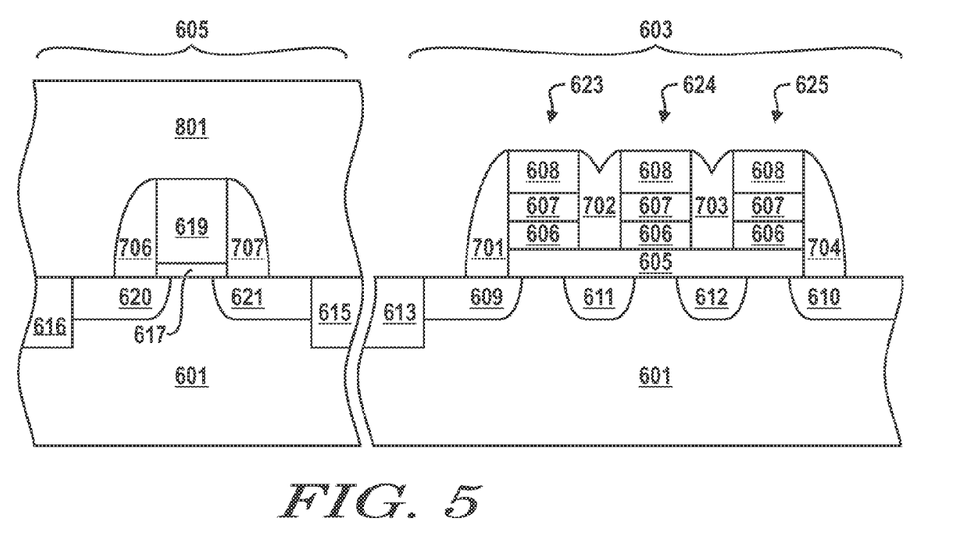
FIG. 5 includes a cross-sectional illustration of the portion of the workpiece of FIG. 4 after forming a mask over a portion of the workpiece including the peripheral transistor structure in accordance with an embodiment.

FIG. 5 includes a cross-sectional illustration of a portion of the workpiece of FIG. 4 after forming a mask over a portion of the workpiece including the peripheral transistor structure 605. In one embodiment, the mask 801 can include a resist material, including for example, an organic material, such as a radiation-sensitive organic material useful in photolithography processing. The mask 801 can be formed by a conventional or proprietary technique.

In one embodiment, the mask 801 can be formed over the entire workpiece and then patterned such that the mask 801 covers certain portions of the workpiece while leaving other portions uncovered. In one particular embodiment, after patterning, the mask 801 overlies the peripheral transistor structure 605 and does not overlie the memory array 603. According to an alternative embodiment, the mask 801 can include a hard mask material, such as a nitride or oxide, or a combination thereof. Such a hard mask 801 can be formed by a conventional or proprietary technique.

Figure 6:
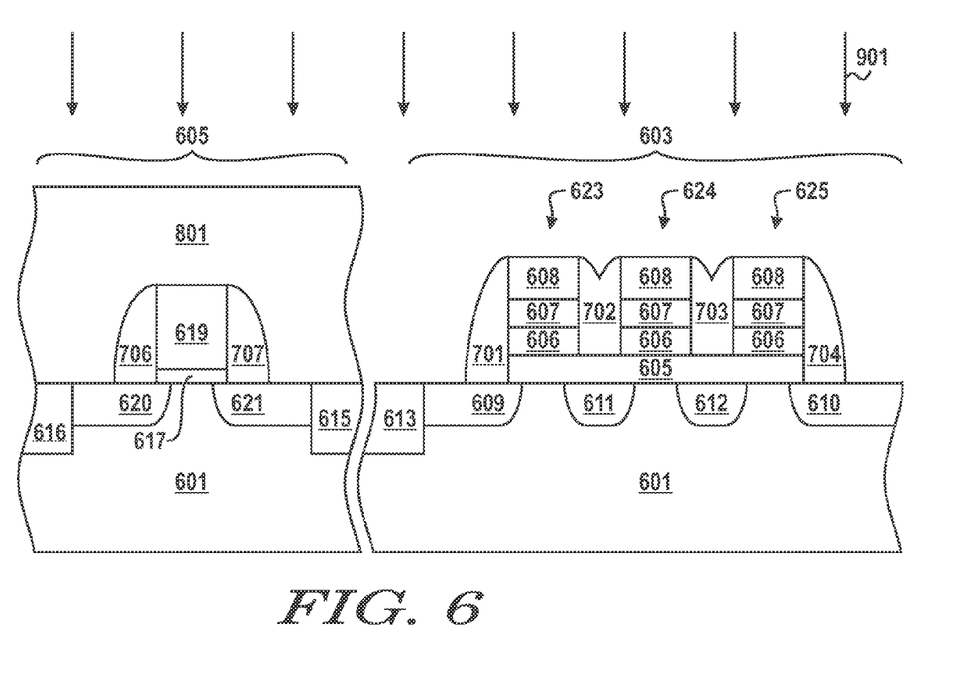
FIG. 6 includes a cross-sectional illustration of the portion of the workpiece of FIG. 5 during a selective ion implanting process in accordance with an embodiment.

FIG. 6 includes a cross-sectional illustration of a portion of the workpiece of FIG. 5 during a selective ion implanting process. As illustrated, during the ion implanting process, ions 901 are directed at the surface of the workpiece and the mask 801. The ions 901 are selectively implanted into portions of the workpiece, and more particularly, portions of the workpiece not covered by the mask 801. Accordingly, in one embodiment, a substantial number of the ions 901 are implanted into portions of the workpiece within the region of the memory array 603 while substantially none of the ions 901 are implanted into the portions of the workpiece within the region of the peripheral transistor structure 605. In one particular embodiment, the selective ion implanting process may inhibit, but not prevent, formation of a metal-semiconductor film, as compared to other portions of the workpiece that are not implanted.

Generally, the ions 901 implanted into the workpiece can include elements or molecules containing a noble gas element, boron, or nitrogen. According to one particular embodiment the ions 901 include nitrogen-containing ions. Suitable nitrogen-containing ions can include elemental nitrogen, or alternatively molecules, such as ammonia or hydrazine. Suitable boron-containing ions can include elemental boron or boron difluoride ($BF_2^+$).

Generally, the ions 901 implanted within portions of the workpiece have an energy of not greater than approximately 20 KeV. In one embodiment, the energy of the ions is less, such as not greater than approximately 18 KeV, or not greater than about 15 KeV. Typically the energy of the ions 901 being implanted within portions of the workpiece have an energy that is at least approximately 1 KeV, such as least approximate 5 KeV. In one particular embodiment, the ions have energies within the range of between approximately 5 KeV and approximately 15 KeV.

During the selective ion implanting process, the dosage of ions provided within portions of the workpiece is generally at least approximately $1\times10^{14}$ ions/cm$^2$. According to one embodiment, the dosage can be greater, such as at least approximately $5\times10^{14}$ ions/cm$^2$ or at least approximately $1\times10^{15}$ ions/cm$^2$. Generally the dosage of ions implanted within portions of the workpiece is not greater than approximately $1\times10^{16}$ ions/cm$^2$.

Figure 7:
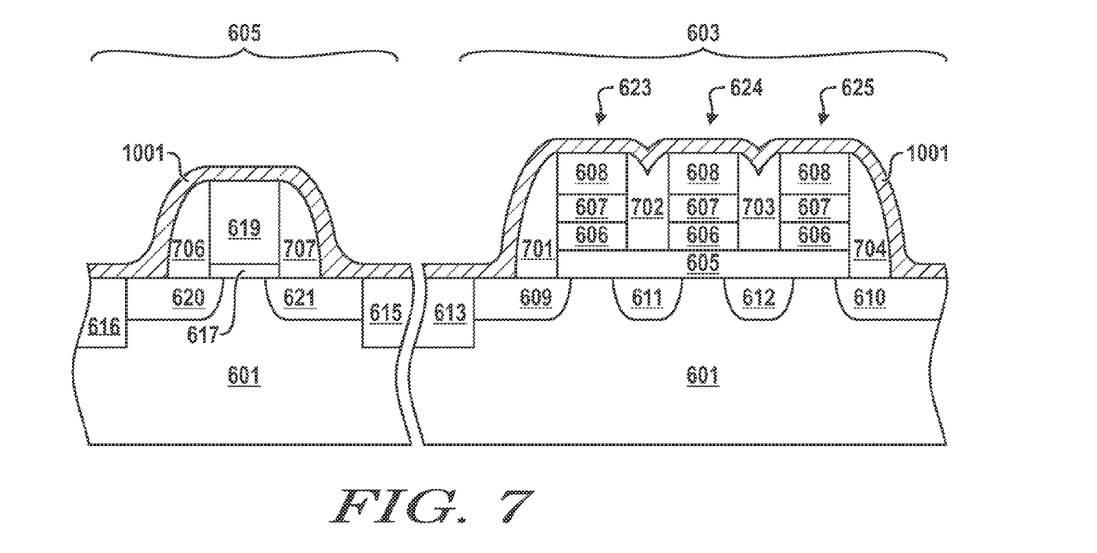
FIG. 7 includes a cross-sectional illustration of the portion of the workpiece of FIG. 6 after the depositing a metal-containing film overlying the workpiece in accordance with an embodiment.

FIG. 7 includes a cross-sectional illustration of the portion of the workpiece illustrated in FIG. 6 after removing the mask overlying the peripheral transistor structure 605 and depositing a metal-containing film overlying the workpiece. The mask 801 can be removed using a conventional or proprietary technique. In reference to the metal-containing film 1001, the metal-containing film 1001 can be formed by a thin-film deposition technique. According to one particular embodiment, the metal-containing film 1001 is formed by a physical vapor deposition (PVD) technique. Such a process can include a reduced pressure atmosphere, including the use of a plasma such as argon plasma and a target material containing the metal to be deposited on the workpiece.

Generally, the metal-containing film 1001 can include a refractory metal material. Suitable refractory metals generally have a melting point over 1400° C. Particularly suitable refractory metals can include cobalt, titanium, tantalum, tungsten, platinum, and palladium. According to one particular embodiment, the metal-containing film 1001 is a cobalt-containing film, consisting essentially of cobalt.

The metal-containing film 1001 is generally deposited over the entire workpiece. The metal-containing film 1001 typically has an averaged thickness as measured over substantially horizontal portions of the workpiece of at least approximately 5 nanometers. In one particular embodiment, the metal-containing film 1001 has an averaged thickness of at least approximately 10 nanometers, such as at least approximately 20 nanometers, or even at least approximately 50 nanometers. In one particular embodiment, the averaged thickness of the metal-containing film 1001 is not greater than approximately 100 nanometers. As used herein, the term "averaged" can include an arithmetic mean, a median, or a geometric mean.

Figure 8:
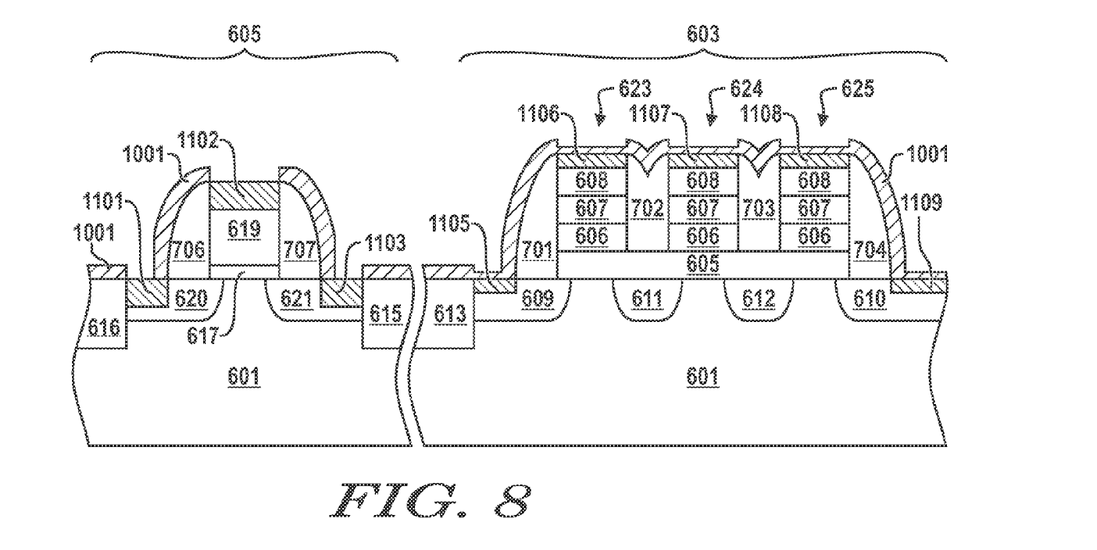
FIG. 8 includes a cross-sectional illustration of the portion of the workpiece of FIG. 7 after reacting portions of the metal-containing film in accordance with an embodiment.

FIG. 8 includes a cross-sectional illustration of the portion of the workpiece of FIG. 7 after reacting portions of the metal-containing film 1001 in accordance with an embodiment. In particular, portions of the metal-containing film 1001 within the peripheral transistor structure 605 react with portions of the peripheral transistor structure 605 to form metal-semiconductor films 1101, 1102, and 1103 (1101-1103). As illustrated, the metal-semiconductor films 1101-1103 are formed within the source/drain regions 620 and 621 and the gate electrode 609. Portions of the metal-containing film also react with the semiconductor material within portions of the memory array 603 forming metal-semiconductor films 1105, 1106, 1107, 1108 and 1109 (1105-1109). The metal-semiconductor films 1105-1109 are formed within the source/drain regions 609 and 610, a portion of the gate electrode of transistor structure 623, a portion of the gate electrode 608 of transistor structure 624, and a portion of the gate electrode 608 of transistor structure 625.

The metal-semiconductor films 1105-1109 may not consume all of the overlying metal-containing film 1001, such that a thin layer of the metal-containing film 1001 may still overlie the formed metal-semiconductor films 1105-1109. The existence of a thin layer of the metal containing film 1001 may result from the metal-semiconductor films 1105-1109 forming at a slower rate than the metal-semiconductor films 1101-1103 due to the selectively implanted ions.

In one particular embodiment, the process of reacting the metal-containing film 1001 with the semiconductor material to form metal-semiconductor films can include an annealing process. In particular, the annealing process can include a rapid thermal annealing (RTA) process. In one particular embodiment, the rapid thermal annealing process includes annealing the workpiece at a temperature of not less than approximately 400° C. to facilitate the formation of the metal-semiconductor films. According to another embodiment, the annealing temperature can be greater, such as not less than approximately 500° C. In another embodiment, the annealing temperature is not greater than approximately 800° C., such as not greater than approximately 700° C. or not greater than approximately 600° C. In one particular embodiment, the annealing temperature is within a range between approximately 500° C. and approximately 600° C.

The annealing process is generally performed over a short time period. In one embodiment, annealing is performed for a time period of not greater than approximately 2 minutes at the annealing temperature. In another embodiment, the workpiece is annealed at the annealing temperature for a time period of not greater than approximately 1 minute, such as not greater than approximately 45 seconds, or even not greater than approximately 30 seconds. According to one particular embodiment, annealing is performed for a time period of at least approximately 15 seconds, such as at least 20 seconds. During the reaction, the atmosphere within the processing chamber generally includes a noble gas, nitrogen, or a combination thereof.

Figure 9:
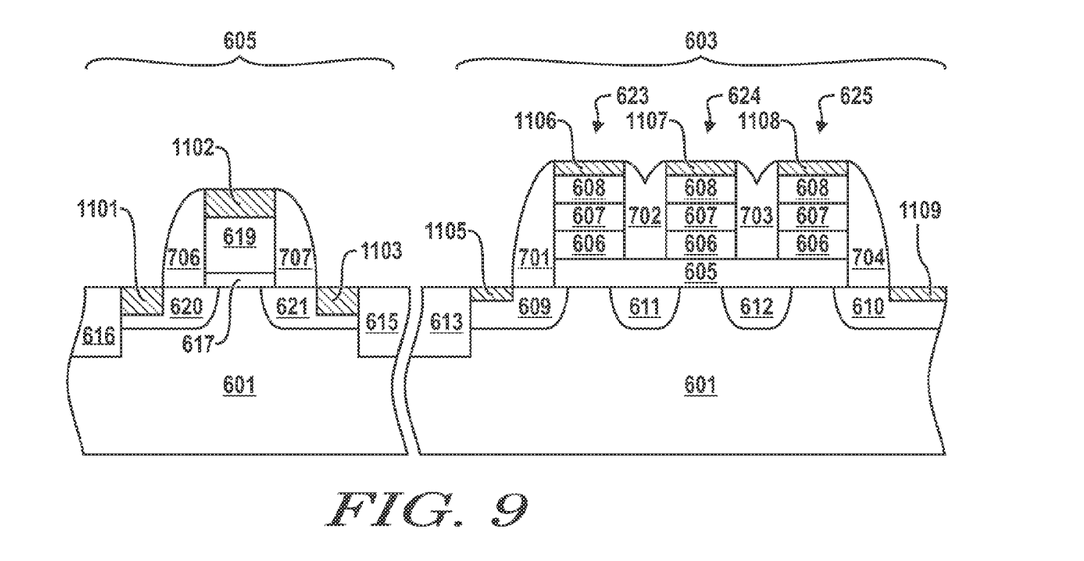
FIG. 9 includes a cross-sectional illustration of the portion of the workpiece of FIG. 8 after removing unreacted portions of the metal-containing film in accordance with an embodiment.

FIG. 9 includes a cross-sectional illustration of a portion of the workpiece of FIG. 8 after removing unreacted portions of the metal-containing film. Removal of the unreacted portions of the metal-containing film can include a selective etch process or other conventional or proprietary technique suitable for removing a metal-containing film from the surface of a workpiece without removing the metal-semiconductor film.

Figure 10:
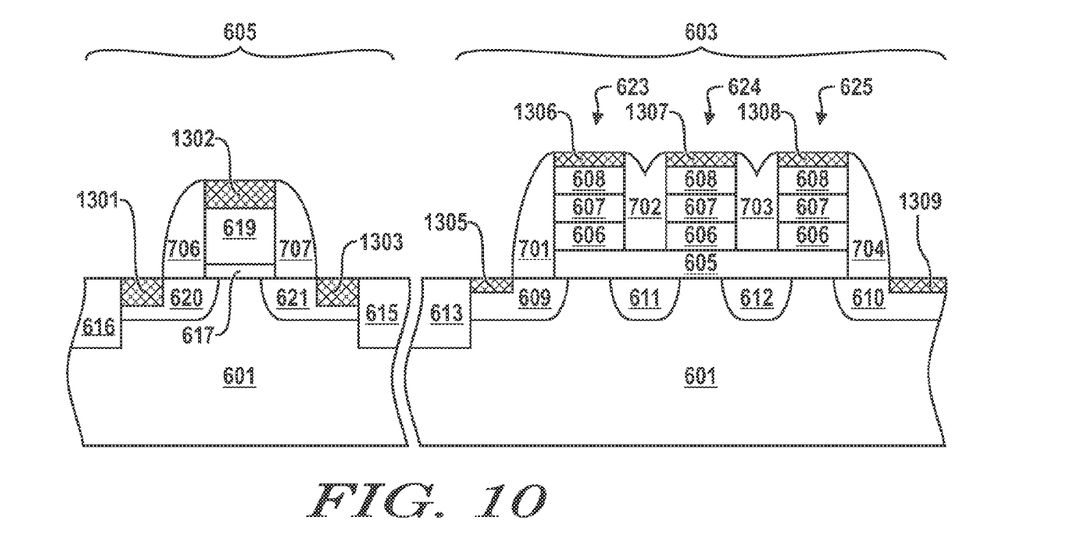
FIG. 10 includes a cross-sectional illustration of the portion of the workpiece of FIG. 9 after annealing the workpiece to form metal-semiconductor films having different thicknesses in accordance with an embodiment.

FIG. 10 includes a cross-sectional illustration of the portion of the workpiece of FIG. 9 after annealing the workpiece to form metal-semiconductor films having different thicknesses. In particular, the peripheral transistor structure 605 includes metal-semiconductor films 1301, 1302, and 1303 (1301-1303) formed within the source/drain regions 620 and 621 and a portion of the gate electrode 609. The memory array 603 includes metal-semiconductor films 1305, 1306, 1307, 1308, and 1309 (1305-1309) formed within the source/drain regions 609 and 610, a portion of the gate electrode 608 of transistor structure 623, a portion of the gate electrode 608 of transistor structure 624, and a portion of the gate electrode 608 of the transistor structure 625.

The metal-semiconductor films 1301-1303 within the peripheral transistor structure 605 and the metal-semiconductor films 1305-1309 within the memory array 603 can be formed by annealing the workpiece. In particular, the workpiece can be annealed to change the crystalline phase of the previously formed metal-semiconductor films. In one particular embodiment, annealing the workpiece to change the crystalline phase of the metal-semiconductor films can include a rapid thermal annealing (RTA) process. Accordingly, in one embodiment, the annealing process can include heating the workpiece to a temperature of at least approximately 600° C. In another embodiment, the annealing process includes heating the workpiece to a temperature of at least approximately 700° C. In another embodiment, the annealing process includes heating the workpiece to a temperature of not greater than approximately 1000° C., such as not greater than approximately 900° C. or even not greater than approximately 800° C. In one particular embodiment, the process of heating a workpiece to change the crystalline phase includes heating the workpiece to a temperature within a range between approximately 700° C. and approximately 800° C.

The temperature used to change the crystalline phase of the metal-semiconductor films (i.e., the phase change temperature) can be greater than the temperature used to react the semiconductor material with the metal-containing film to form the metal-semiconductor film (i.e., the reaction temperature). In one particular embodiment, the difference between the phase change temperature and the reaction temperature is at least approximately 25° C. In another embodiment, the difference between the phase change temperature and the reaction temperature is at least approximately 50° C., or at least approximately 75° C. According to another embodiment, the phase change temperature is greater than the reaction temperature by not greater than approximately 300° C., such as not greater than approximately 200° C. In one particular embodiment, the phase change temperature is greater than the reaction temperature by a temperature within a range between approximately 75° C. and approximately 150° C.

Generally, the process of heating the workpiece to change the crystalline phase of the metal-semiconductor films is performed at the annealing temperature for a time period of not greater than approximately 2 minutes. Other embodiments utilize a shorter time period, such as not greater than approximately 90 seconds or not greater than approximately 60 seconds. Still, in one embodiment, the time period for annealing at the annealing temperature is at least approximately 5 second, such as at least approximately 10 seconds, or at least approximately 15 seconds. In one particular embodiment, annealing the workpiece to change the crystalline phase of the metal-semiconductor film is performed at the annealing temperature for a time period within a range between approximately 15 seconds and approximately 60 seconds. Generally, a suitable atmosphere for conducting the annealing process can include a noble gas such as argon or alternatively, nitrogen or any combination thereof.

As illustrated, the metal-semiconductor films 1301-1303 and metal-semiconductor films 1305-1309 can be formed on different portions of the peripheral transistor structure 605 and the memory array 603. In one particular embodiment, the metal-semiconductor films can be formed within the peripheral transistor structure 605 and the memory array 603 wherein these structures 603 and 605 have the same composition within their source/drain regions. More particularly, in one embodiment, the metal-semiconductor films 1301 and 1303 are formed within source/drain regions 620 and 621 of the peripheral transistor structure 605 that are arsenic-doped regions, and the metal-semiconductor films 1305 and 1309 formed within the source/drain regions 609 and 610 of the memory array 603 that are also arsenic-doped regions. Moreover, the metal-semiconductor film 1302 within the peripheral transistor structure 605 can overlie the same type of gate electrode material as the metal-semiconductor films 1306-1308 within the memory array 603.

In particular, the metal-semiconductor films 1301-1303 and metal-semiconductor films 1305-1309 can include a refractory metal combined with silicon. According to one particular embodiment, the metal-semiconductor films 1301-1303 and 1305-1309 include cobalt, such that these films are made essentially of cobalt and silicon ($CoSi_2$).

As further illustrated in FIG. 10, the metal-semiconductor films 1301-1303 within the peripheral transistor structure 605 have an averaged thickness that is different than the metal-semiconductor films 1305-1309 within the memory array 603. The selective ion implanting process, and the corresponding interactions of the ions with the semiconductor material slowed the formation of the metal-semiconductor films 1305-1309 and facilitate the formation of metal-semiconductor layers 1305-1309 having a different averaged thickness than those metal-semiconductor films 1301-1303. In one particular embodiment, the metal-semiconductor films 1305-1309 have an averaged thickness that is significantly less than the averaged thickness of the metal-semiconductor films 1301-1303. As such, in one particular embodiment, the metal-semiconductor films 1305-1309 have an averaged thickness that is at least approximately 11 nm thinner than the averaged thickness of the metal-semiconductor films 1301-1303. In another embodiment, the difference can be greater, such that the metal-semiconductor films 1305-1309 have an averaged thickness that is at least approximately 13 nm thinner, such as at least approximately 15 nm thinner, or even at least approximately 20 nm thinner. Generally, the difference in the average thickness of the metal-semiconductor films 1305-1309 within the memory array 603 and the metal-semiconductor films 1301-1303 within the peripheral transistor structure 605 is not greater than approximately 35 nm.

Typically, the averaged thickness of the metal-semiconductor films 1305-1309 within the memory array 603 is not greater than approximately 50 nm. In another embodiment the metal-semiconductor films 1305-1309 have an averaged thickness of not greater than approximately 45 nm, such as not greater than approximately 40 nm, or even not greater than approximately 30 nm. The metal-semiconductor films 1305-1309 typically have an averaged thickness of at least approximately 15 nm.

The metal-semiconductor films 1301-1303 within the peripheral transistor structure 605 typically have an averaged thickness of at least approximately 30 nm. More typically, the averaged thickness of the metal-semiconductor films 1301-1303 is at least approximately 40 nm. In one particular embodiment, the averaged thickness of the metal-semiconductor films 1301-1303 is at least approximately 45 nm, such as at least approximately 50 nm, and even at least approximately 60 nm. In one particular embodiment, the metal-semiconductor films 1301-1303 have an averaged thickness that is not greater than approximately 80 nm.

Figure 11:
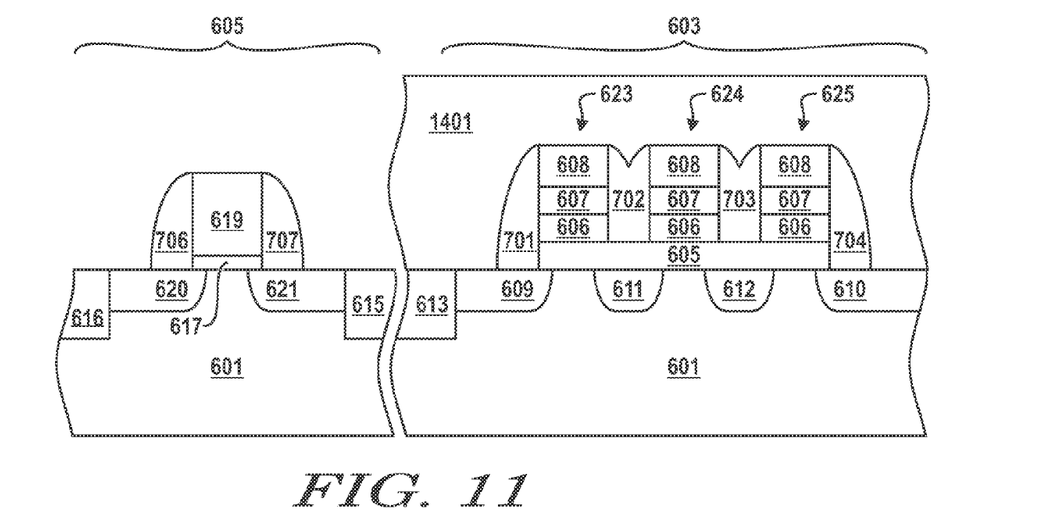
FIG. 11 includes a cross-sectional illustration of a portion of a workpiece including a substrate, a portion of a memory array overlying the substrate, a peripheral transistor structure overlying the substrate and spaced apart from the memory cell, and a mask overlying the memory array in accordance with an embodiment.

Referring now to FIGS. 11-16, an alternative embodiment of forming metal-semiconductor films having different thicknesses within different electronic components is described. In particular, the following description accompanying FIGS. 11-16 describes selectively implanting ions within portions of the workpiece to cause implant damage to the semiconductor material within portions of the workpiece, which can facilitate accelerated formation of a metal-semiconductor film. FIG. 11 includes a cross-sectional illustration of a portion of a workpiece as illustrated in FIG. 4, including a substrate 601, a peripheral transistor structure 605, and a portion of a memory array 603 (hereinafter "memory array 603").

FIG. 11 further includes a mask 1401 formed over a portion of the workpiece, and more particularly over the memory array 603. The mask 1401 can be formed over the memory array 603 using materials and processes described herein in accordance with FIG. 5.

Figure 12:
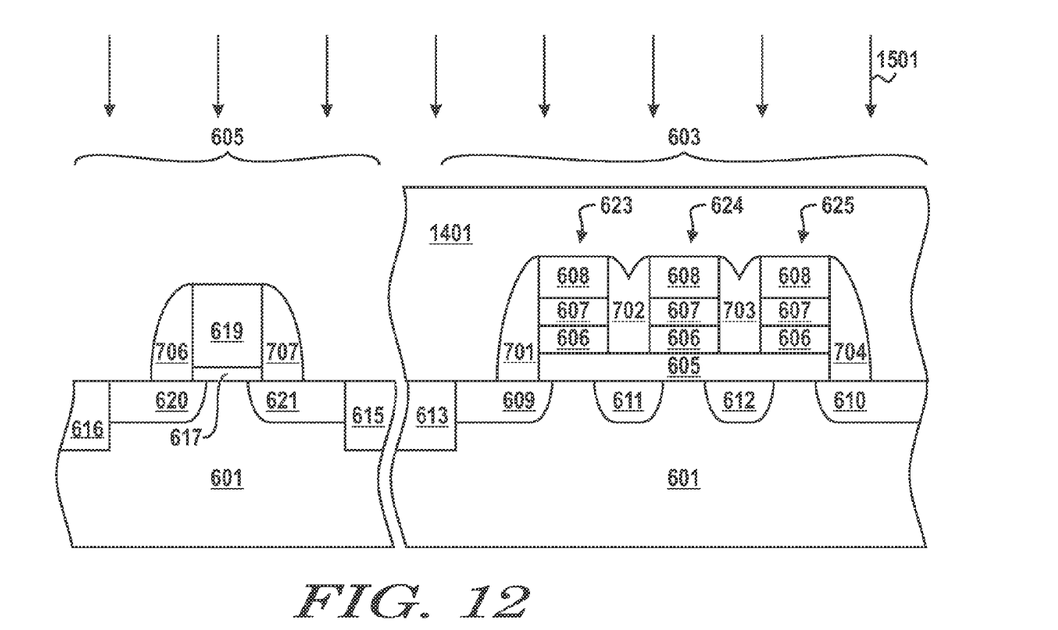
FIG. 12 includes a cross-sectional illustration of the portion of the workpiece of FIG. 11 during a selective ion implanting process in accordance with an embodiment.

FIG. 12 includes a cross-sectional illustration of the portion of the workpiece illustrated in FIG. 11 during a selective ion implanting process. As illustrated, ions 1501 are selectively implanted within portions of the workpiece, particularly those portions not covered by the mask 1401. In one particular embodiment, the mask 1401 overlies the memory array 603 such that the ions 1501 are implanted into the region of the workpiece containing the peripheral transistor structure 605 while substantially none of the ions 1501 are implanted within the workpiece containing the memory array 603. Since substantially none of the ions 1501 are implanted within the portion of the workpiece covered by the mask 1401, substantially none of the semiconductor material within the region of the memory array 603 is damaged by the ions 1501.

In one particular embodiment, the ions 1501 can include elements or compounds containing a noble gas element. In one particular embodiment, the ions include argon or another noble gas element heavier than the semiconductor material within the workpiece. The energy and dosage of the ions 1501 are substantially the same as those disclosed herein in accordance with FIG. 6.

Figure 13:
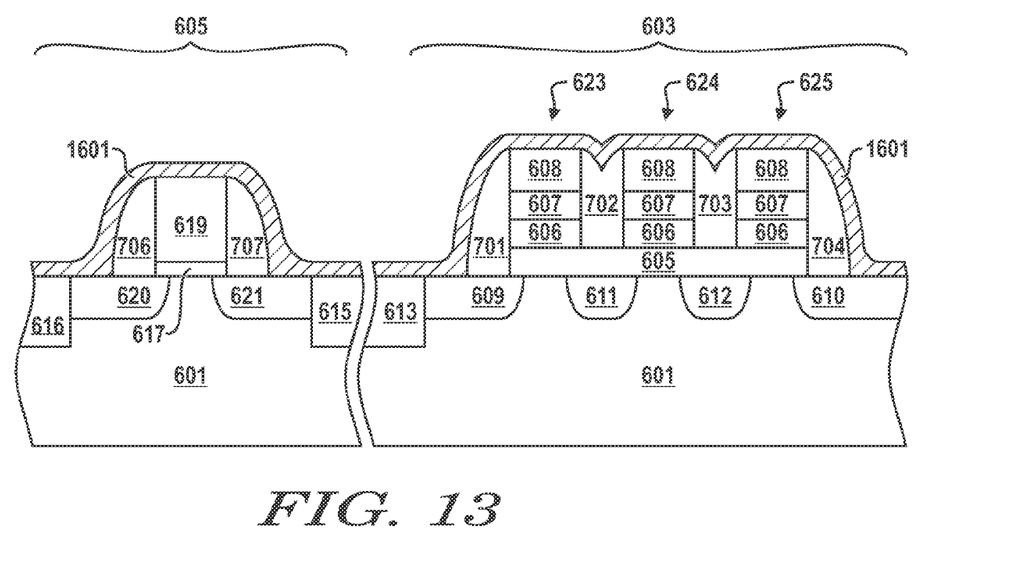
FIG. 13 includes a cross-sectional illustration of the portion of the workpiece of FIG. 12 after the depositing a metal-containing film overlying the workpiece in accordance with an embodiment.

FIG. 13 includes a cross-sectional illustration the portion of the workpiece illustrated in FIG. 12 after depositing a metal-containing film 1601 over the workpiece. The metal-containing film 1601 can be formed using processes described herein in accordance with FIG. 7. Moreover, the metal-containing film 1601 can include those materials described herein in accordance with FIG. 7. In a particular embodiment, the metal-containing film 1601 is deposited over the portions of the workpiece while a significant portion of the implant damage remains unrepaired.

Figure 14:
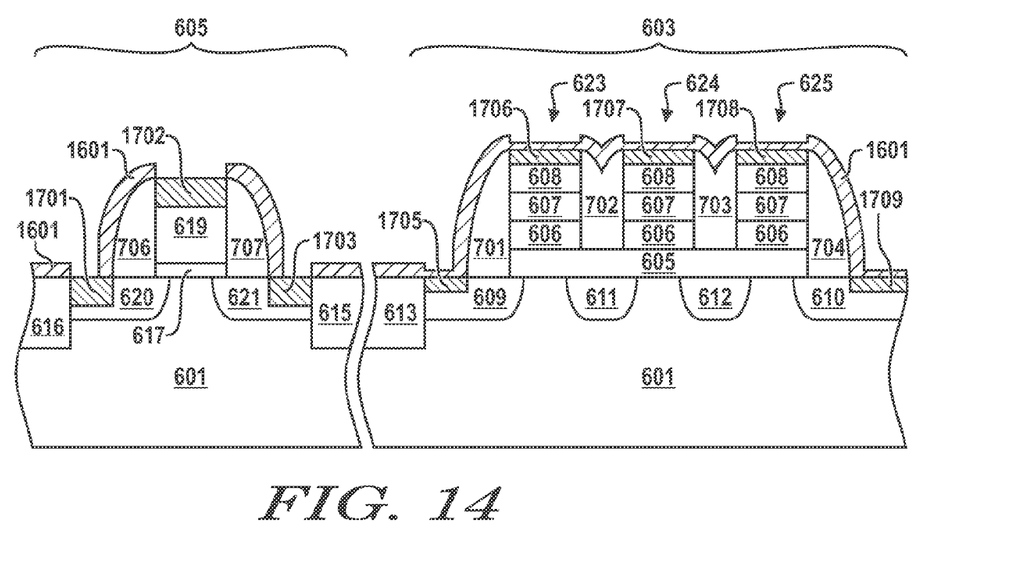
FIG. 14 includes a cross-sectional illustration of the portion of the workpiece of FIG. 13 after reacting portions of the metal-containing film in accordance with an embodiment.

FIG. 14 includes a cross-sectional illustration of the portion of the workpiece illustrated in FIG. 13 after reacting portions of the metal-containing film 1601 with semiconductor materials within the peripheral transistor structure 605 and the memory array 603 to form metal-semiconductor films 1701-1703 and 1705-1709. The process of reacting portions of the metal-containing film 1601 with semiconductor materials are the same processes as described herein in accordance with FIG. 8, particularly an annealing process. Since the deposition of the metal-containing film 1601 was conducted while a significant portion of the implant damage remained unrepaired within the peripheral transistor structure 605, the process of reacting a portion of the metal-containing film 1601 facilitates consuming a significant portion, if not substantially all, of the implant damage within the peripheral transistor structure 605.

Figure 15:
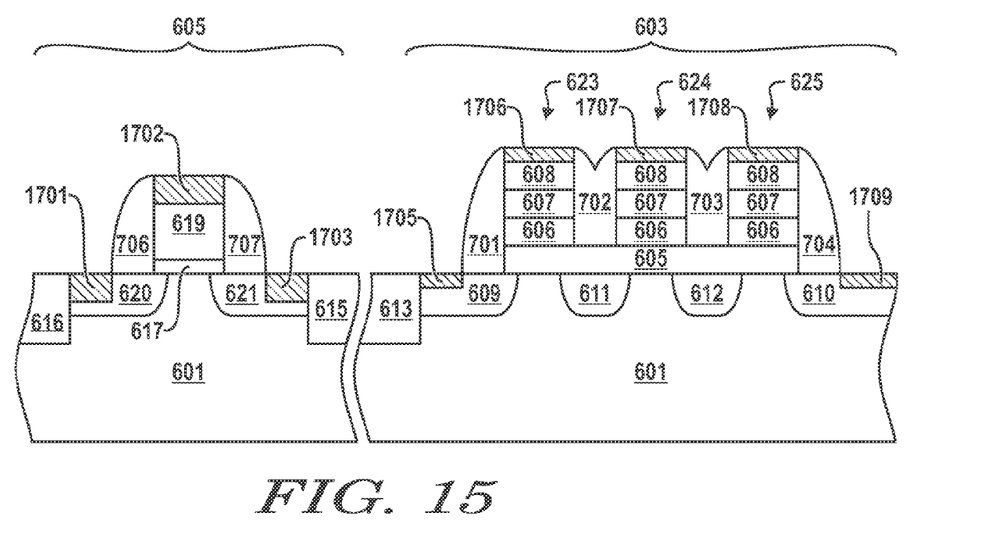
FIG. 15 includes a cross-sectional illustration of the portion of the workpiece of FIG. 14 after removing unreacted portions of the metal-containing film in accordance with an embodiment.

FIG. 15 includes a cross-sectional illustration of the workpiece of FIG. 14 after removal of unreacted portions of the metal-containing film. The removal of the metal-containing film can include a selective etch process or another conventional or proprietary technique as described herein in accordance with FIG. 9.

Figure 16:
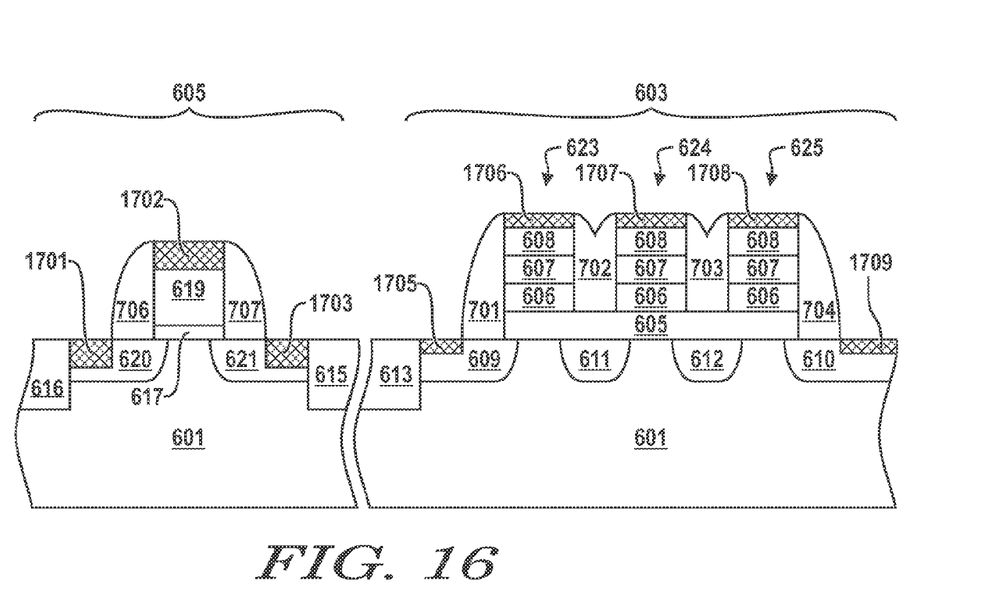
FIG. 16 includes a cross-sectional illustration of the portion of the workpiece of FIG. 15 after annealing the workpiece to form metal-semiconductor films having different thicknesses in accordance with an embodiment.

FIG. 16 includes a cross-sectional illustration of a portion of the workpiece of FIG. 15 after forming metal-semiconductor films within portions of the peripheral transistor structure 605 and the memory array 603. In particular, the process of forming the metal-semiconductor film 1701-1703 and 1705-1709 within the peripheral transistor structure 605 and the memory array 603, are the same processes described herein in accordance with FIG. 10. Particularly, such a process can include an annealing process to facilitate a phase change in the metal-semiconductor films. More particularly, as illustrated in FIG. 16, the metal-semiconductor films 1701-1703 formed within the peripheral transistor structure 605 have a significantly different thickness than the metal-semiconductor films 1705-1709 formed within the memory array 603. The selective ion implanting process caused implant damage to the semiconductor material within the peripheral transistor structure 605 and facilitated the growth of thicker metal-semiconductor films 1701-1703 in comparison to those metal-semiconductor films 1705-1709 within the memory array 603.

In particular, the selective ion implanting process coupled with the particular reacting and annealing processes facilitates the formation of metal-semiconductor films having different thicknesses within different regions of the workpiece. The formation of such structures using the processes disclosed herein facilitates enhanced device performance, extended device lifetime, as well as the reduction of certain processing defects including, for example, pitting, grooving, and agglomeration. The formation of metal-semiconductor films having different thicknesses within different devices facilitates the formation of transistor structures and electronic components suited for particular purposes and particular operating parameters. For example, the transistors within peripheral transistor structures including logic circuits may be subject to higher voltages and thus a more robust metal-semiconductor film is desirable for enhanced performance, while transistor structures within memory cells may be subject to lower voltages and thus can make use of thinner metal-semiconductor films.

Many different aspects and embodiments are possible. Some of those aspects and embodiments are described below. After reading this specification, skilled artisans will appreciate that those aspects and embodiments are only illustrative and do not limit the scope of the present invention.

According to a first aspect a method of forming an electronic device is disclosed that includes selectively implanting ions into a workpiece, such that ions are implanted into a first region of the workpiece, wherein the first region includes a semiconductor material and substantially none of the ions are implanted into a second region of the workpiece, wherein the second region includes the semiconductor material. The method of the first aspect further includes depositing a metal-containing film over the first region and the second region, wherein depositing is performed after selectively implanting and then reacting the metal-containing film with the semiconductor material to form a first metal-semiconductor film within the first region and a second metal-semiconductor film within the second region. As such the first metal-semiconductor film has a first thickness and the second metal-semiconductor film has a second thickness that is different from the first thickness.

According to one embodiment of the first aspect, selectively implanting ions includes implanting nitrogen ions within a memory cell within the first region and substantially no nitrogen ions within a peripheral component within the second region. In another embodiment, selectively implanting ions includes implanting ions having an energy of not greater than approximately 20 KeV. In still another embodiment, selectively implanting ions includes providing a dosage of ions of at least approximately $1 \times 10^{14}$ ions/cm$^2$.

According to one embodiment of the first aspect, the memory cell includes a non-volatile memory cell and the peripheral component comprises a transistor in a logic circuit. In another embodiment, the metal-containing film includes a refractory metal. In a more particular embodiment, depositing a metal-containing film includes depositing a cobalt film having an averaged thickness of at least approximately 5 nm.

According to an embodiment of the first aspect, selectively implanting ions into a workpiece further includes the process of forming a photoresist mask over the workpiece, exposing a portion of the photoresist mask within the first region to radiation, and removing the photoresist mask from the first region. In another embodiment, selectively implanting ions includes causing implant damage within the semiconductor material within the first region. In still another embodiment, the method of depositing a metal-containing film further includes depositing the metal-containing film while a significant portion of the implant damage within the first region remains unrepaired, and reacting comprises consuming a significant portion of the implant damage within the first region. In a more particular embodiment, reacting is completed at a temperature for a time period of not greater than approximately 2 minutes. In another particular embodiment, reacting is completed in an atmosphere comprising a noble gas, nitrogen, or a combination thereof.

According to another embodiment of the first aspect, the method further includes removing unreacted portions of the metal-containing film from the first region and the second region after consuming the implant damage. In one embodiment the method further includes heating the workpiece to change a crystalline phase of the first metal-semiconductor film and the second metal-semiconductor film after consuming the implant damage.

In another embodiment of the first aspect, the first thickness is thicker than the second thickness. In a more particular embodiment, the first metal-semiconductor film has an averaged thickness that is significantly less than an averaged thickness of the second metal-semiconductor film. In a more particular embodiment, the first metal-semiconductor film comprises CoSi$_2$, the second metal-semiconductor film comprises CoSi$_2$, and the first metal-semiconductor film and the second metal-semiconductor film are portions of gate electrodes. In another particular embodiment, the first metal-semiconductor film overlies a first arsenic-doped source/drain region and the second metal-semiconductor film overlies a second arsenic-doped source/drain region.

According to a second aspect a method of forming an electronic device is provided that includes selectively implanting ions into a workpiece such that nitrogen-containing ions are implanted into a first region comprising a memory cell, and substantially none of the nitrogen-containing ions are implanted into a second region comprising a peripheral logic component. The method further includes depositing a cobalt-containing film over the workpiece, and annealing the workpiece at an annealing temperature of at least approximately 400° C. to form a first metal-semiconductor film on a portion of the memory cell and a second metal-semiconductor film on a portion of the peripheral logic component. The method also includes removing unreacted portions of the metal-containing film from portions of the memory cell and portions of the peripheral logic component, and annealing the workpiece to change a crystalline phase of the first metal-semiconductor film and the second metal-semiconductor film, wherein the first metal-semiconductor film has an averaged thickness that is significantly thinner than an averaged thickness of the second metal-semiconductor film.

In one embodiment of the second aspect the averaged thickness of the first metal-semiconductor film is at least approximately 11 nm thinner than the averaged thickness of the second metal-semiconductor film.

What is claimed is:

1. An electronic device comprising:
a first transistor structure lying within a first region of a substrate, wherein the first transistor structure comprises a first charge storage layer, a first gate electrode overlying the first charge storage layer, and a first metal-semiconductor film overlying the first gate electrode;
a second transistor structure spaced apart from the first transistor structure and overlying a second region of the substrate, wherein the second transistor structure comprises a gate dielectric layer, a second gate electrode overlying the second gate dielectric layer, and a second metal-semiconductor film overlying the second gate electrode, wherein the first metal-semiconductor film has an averaged thickness that is significantly different than an averaged thickness of the second metal-semiconductor film; and
wherein the first transistor structure comprises a first source/drain region within the substrate underlying a portion of the first gate electrode and the second transistor structure comprises a second source/drain region within the substrate underlying a portion of the second gate electrode, wherein the first source/drain region has an average depth that is substantially the same as the second source/drain region.

2. The electronic device of claim 1, wherein:
each of the first gate electrode and the second gate electrode includes silicon; and
the first metal-semiconductor film and the second metal-semiconductor film have substantially a same composition.

3. The electronic device of claim 1, wherein the first transistor structure and the second transistor structure are separated from each other by a field isolation region within the substrate.

4. The electronic device of claim 3, wherein the first region comprises a memory cell comprising a plurality of transistor structures including the first transistor structure.

5. The electronic device of claim 4, wherein the memory cell is a non-volatile memory cell.

6. The electronic device of claim 4, wherein the second region comprises a peripheral logic component including the second transistor structure.

7. The electronic device of claim 1, wherein the averaged thickness of the first metal-semiconductor film has a thickness significantly less than the averaged thickness of the second metal-semiconductor film.

8. The electronic device of claim 1, wherein the first and second metal-semiconductor films comprise a refractory metal.

9. The electronic device of claim 8, wherein the first and second metal-semiconductor films comprise $CoSi_2$.

10. The electronic device of claim 1, wherein the first transistor structure further comprises
a third metal-semiconductor film overlying the first source/drain region.

11. The electronic device of claim 10, wherein the third metal-semiconductor film comprises substantially a same averaged thickness as the first metal-semiconductor film.

12. The electronic device of claim 10, wherein the second transistor structure further comprises
a fourth metal-semiconductor film overlying the second source/drain region.

13. The electronic device of claim 12, wherein the fourth metal-semiconductor film comprises substantially a same averaged thickness as the second metal-semiconductor film.

14. The electronic device of claim 12, wherein the third metal-semiconductor film has an averaged thickness significantly less than an averaged thickness of the fourth metal-semiconductor film.

15. The electronic device of claim 10, wherein the first source/drain region and the second source/drain region are n-type doped regions.

16. The electronic device of claim 15, wherein the first source/drain region and the second source/drain region comprise arsenic.

17. The electronic device of claim 1, wherein each of the first and second gate electrodes comprises silicon.

18. The electronic device of claim 1, wherein the first transistor structure includes an ONO stack including the first charge storage layer.

19. The electronic device of claim 1, wherein the second transistor structure is a logic transistor.

20. An electronic device comprising:
a memory cell including a first transistor structure comprising a first charge storage layer, a first gate electrode overlying the first charge storage layer, a first metal-semiconductor film overlying the first gate electrode, a first source/drain region underlying a portion of the first gate electrode, and a second metal-semiconductor film lying within the first source/drain region;
a peripheral logic component including a second transistor structure comprising a gate dielectric layer, a second gate electrode overlying the gate dielectric layer, a third metal-semiconductor film overlying the second gate electrode, a second source/drain region underlying a portion of the second gate electrode, and a fourth metal-semiconductor film lying within the second source/drain region,
wherein:
the second transistor structure is separated from the first transistor structure by a field isolation region; and
the first and second metal-semiconductor films have an averaged thickness that is significantly different than an averaged thickness of the third and fourth metal-semiconductor film; and
the first source/drain region has an average depth that is substantially the same as the second source/drain region.

* * * * *